United States Patent [19]

Kosugi et al.

[11] Patent Number: 4,786,947
[45] Date of Patent: Nov. 22, 1988

[54] PROJECTION EXPOSURE APPARATUS

[75] Inventors: Masao Kosugi, Yokohama; Toshikazu Matsushita, Tokyo; Shuichi Yabu, Kawasaki; Masakatsu Ohta, Tokyo, all of Japan

[73] Assignee: Canon Kabushiki Kaisha, Tokyo, Japan

[21] Appl. No.: 45,203

[22] Filed: May 4, 1987

Related U.S. Application Data

[63] Continuation of Ser. No. 915,867, Oct. 7, 1986, abandoned, which is a continuation of Ser. No. 814,967, Dec. 31, 1985, abandoned.

[30] Foreign Application Priority Data

Jan. 10, 1985 [JP] Japan .................................. 001479

[51] Int. Cl.[4] ............................................. G03B 27/52
[52] U.S. Cl. .................................. 355/30; 353/101; 355/53
[58] Field of Search ..................... 353/101; 355/52–54, 355/30, 43, 45

[56] References Cited

U.S. PATENT DOCUMENTS

| | | | |
|---|---|---|---|
| 3,936,184 | 2/1976 | Tanaka et al. | 355/30 X |
| 4,050,802 | 9/1977 | Tanaka et al. | 355/30 X |
| 4,198,159 | 4/1980 | Cachon | 355/55 |
| 4,202,623 | 5/1980 | Watkin | 355/30 |
| 4,477,183 | 10/1984 | Kawamura et al. | 355/55 |
| 4,496,239 | 1/1985 | Isohata et al. | 355/30 |
| 4,503,335 | 3/1985 | Takahashi | 355/30 X |
| 4,540,251 | 9/1985 | Yau et al. | 355/30 X |
| 4,564,284 | 1/1986 | Tsutsui | 355/30 |
| 4,583,840 | 4/1986 | Yabu et al. | 355/30 |
| 4,690,528 | 9/1987 | Tanimoto et al. | 353/101 |

Primary Examiner—Richard A. Wintercorn
Attorney, Agent, or Firm—Fitzpatrick, Cella, Harper & Scinto

[57] ABSTRACT

A semiconductor device manufacturing projection exposure apparatus in which a pattern of a reticle is projected onto a semiconductor wafer through a projection optical system having a lens element and in which the reticle is irradiated with a light of a predetermined wavelength to thereby transfer the pattern of the reticle onto the semiconductor wafer. The apparatus includes a chamber adapted to house the reticle, the wafer and the projection optical system in a substantially closed space, detectors for detecting a temperature and a pressure of a gas contained in the space, and an adjusting unit for adjusting the temperature and pressure of the gas in the chamber, from the outside of the chamber, the operation of the adjusting unit being controlled on the basis of the detection by the detectors, whereby the temperature and pressure of the gas contained in the space are regulated so as to be best suited to retain a predetermined optical performance of the projection optical system and, whereby, high-precision pattern transfer is assured.

8 Claims, 3 Drawing Sheets

PROJECTION EXPOSURE APPARATUS

This application is a continuation of application Ser. No. 915,867 filed Oct. 7, 1986 now abandoned, which is a continuation of application Ser. No. 814,967 filed Dec. 31, 1985, now abandoned.

FIELD OF THE INVENTION AND RELATED ART

This invention relates to a projection optical device and, more particularly, to a projection exposure apparatus such as a mask manufacturing repeater, a step-and-repeat type alignment and exposure apparatus or the like usable in the process of manufacture of semiconductor devices, such as integrated circuits (ICs), large scaled integrated circuits (LSIs), etc.

In a refracting optical system, changes in ambient pressure, ambient temperature, an ambient humidity or the like cause a minute change in optical performance of the refracting optical systems, such as imaging performance (particularly the position of focus, magnification, distortion and the like. As regards the imaging performance, for example, any change in the ambient pressure or humidity causes changes in the refractive index of the surrounding air. On the other hand, change in the ambient temperature causes changes in the refractive indices of the air and the glass material of the refracting optical system as well as deformation of the glass material and a metal support therefor due to thermal expansion (or contraction). These changes and/or deformation result in minute changes in the optical performance of the refracting optical system.

In a projection lens system employed in the repeater or the step-and-repeat type alignment and exposure apparatus (which hereinafter simply "stepper") for use in the process of manufacture of semiconductor devices, such minute changes in the optical performance as described above have become nonnegligible because of recent tendencies toward higher capacity of the semiconductor device or further miniaturization in the line width of the semiconductor device.

As for the temperature change which is one of the factors causing the variations in the optical performance, control of the temperature is relatively easy to achieve and, therefore, temperature control has conventionally been adopted in some of the projection exposure apparatuses.

Regarding the humidity, on the other hand, the change in humidity, if alone, has a little effect on the optical performance of the optical system. For this reason, precise control of the humidity has been regarded unnecessary.

As compared therewith, the pressure surrounding the optical system has a very significant effect on the optical performance. But, nevertheless, control of the ambient pressure is not easy to achieve.

The focus error itself due to the change in pressure may be dealt with relatively easily, by monitoring the pressure change and by supplying to a focus control system a data on a focus offset value obtainable in accordance with a previously detected coefficient or constant for focus deviation due to the pressure change. However, as regards the magnification error and the change in the distortion characteristics due to the change in pressure, it is not easy to correct the focus error and it is practically very difficult to eliminate the change in distortion, by means of adjustment of the structure of the apparatus being operated. In view of this and of the fact that the temperature control is relatively easy, it has been proposed to adjust the ambient temperature by an amount corresponding to the pressure change to thereby correct errors caused by the pressure change. In such case, it may be possible to arrange the apparatus such that the pressure and the thus controlled temperature are monitored, and then data on the focus error calculated on the basis of a coefficient of focus is supplied to the focus control system so as to adjust the focus more precisely.

For such correction of the optical performance by the temperature control, however, it is necessary to consider the effect of the temperature control, relative to the components or elements other than the optical system. For example, the adjustment of the temperature for the sake of correction of the optical performance of the optical system may cause thermal expansion (or contraction) of the semiconductor wafer which is an element onto which the circuit pattern of the reticle is to be transferred. That is, to change the temperature may be causative of some other change. For this reason, it is not practical to effect the temperature control only for the sake of correction of the optical performance.

Viewing a projection optical system included in an optical instrument, it is possible that the projection optical system has a portion which is particularly susceptible to the pressure change in respect to the magnification and distortion. It is therefore possible, in principle, to control the magnification and distortion by controlling the pressure in a definite space only enclosed by lens components and a barrel of the projection optical system. Even if, however, it is assumed that the pressure (atmospheric pressure) changes in a range of approx. $\pm 2\%$ (0.02 kg/cm$^2$), the pressure difference to be caused between the opposite sides of one lens component will result in deformation of the lens component, due to the distributed pressure. And, such deformation will change the optical performance by an amount in substantial excess of a tolerance.

SUMMARY OF THE INVENTION

It is accordingly a primary object of the present invention to provide a projection exposure apparatus in which high-precision optical performance such as imaging performance, distortion, magnification, etc. are assured stably.

It is another object of the present invention to provide a projection exposure apparatus in which the disturbance factors themselves, affecting the optical performance, are controlled or regulated, thereby to assure high-precision pattern transfer.

It is a further object of the present invention to provide a projection exposure apparatus in which the disturbance factors themselves, affecting the optical performance, can be accurately controlled or regulated with a very simple structure.

It is a still further object of the present invention to provide a projection exposure apparatus effectively usable in the process of manufacture of semiconductor devices.

These and other objects, features and advantages of the present invention will become clear upon a consideration of the following description of the preferred embodiments of the present invention taken in conjunction with the accompanying drawings.

DESCRIPTION OF THE PREFERRED EMBODIMENTS

Figure 1:
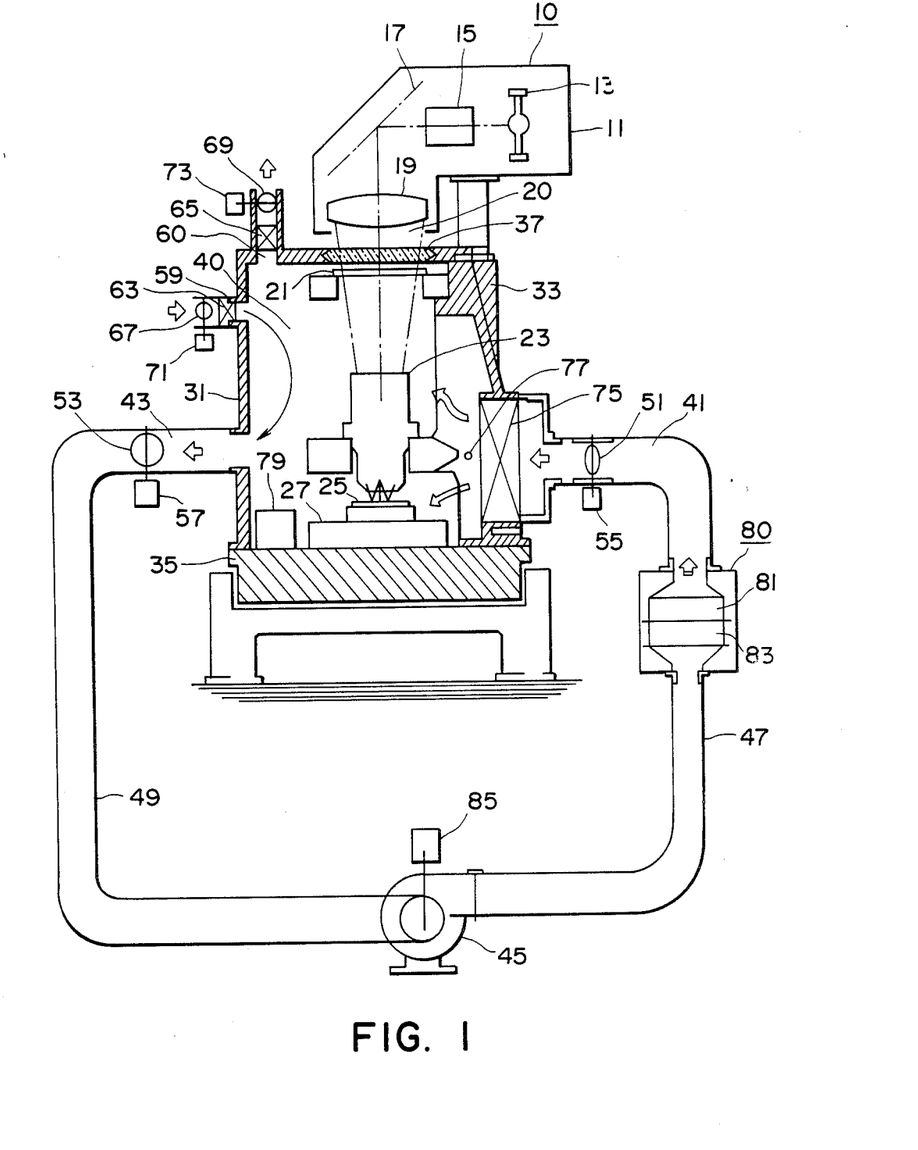
FIG. 1 is a schematic view of a projection exposure apparatus according to an embodiment of the present invention.

Referring first to FIG. 1, there is schematically shown a projection exposure apparatus according to one embodiment of the present invention, which is applied to a step-and-repeat type alignment and exposure apparatus, called a stepper.

As shown in FIG. 1, the apparatus includes, as one of the major components thereof, an illumination system 10 which comprises a light source 13, a lens system 15, a reflecting mirror 17 and another lens system 19, all of which are co-operative to each other and provide an illuminating light beam 20 directed to a reticle 21. The reticle 21 is held by a holder and has a circuit pattern formed thereon. The apparatus further includes a projection lens system 23 for projecting the pattern of the reticle 21 onto a semiconductor wafer 25 supported by an X-Y stage 27. The circuit pattern of the reticle 21 is transferred onto the semiconductor wafer 25 by irradiating the reticle 21 with the light beam, of a predetermined wavelength, supplied from the illumination system 10, while the reticle 21 and the wafer 25 are maintained in such state in which the circuit pattern of the reticle 21 is correctly projected onto the wafer 25.

The reticle 21, the projection lens 23, the wafer 25 and the X-Y stage 27 are housed in a substantially closed space. That is, these elements are contained in a substantially gastight chamber 40 which is defined by portions as depicted by hatched areas in FIG. 1. More specifically, the gastight chamber 40 has a side portion defined by a wall 31 and a saddle 33; a lower portion defined by a surface plate 35; and an upper portion defined by an upper wall and a parallel-surface glass plate 37 made of a transmissive material for allowing passage of the light from the illumination system 10. Particularly where the pressure in the gastight chamber 40 should be maintained lower than the atmospheric pressure, it is necessary to provide sufficient gastightness of the chamber 40 in order to prevent introduction of an ambient gas or air which may include dust or foreign particles. Practically, the chamber 40 is provided with an access opening sealingly closed by a movable door member, for the purpose of access to the interior of the chamber 40, as well as an observation window sealingly closed by a glass plate, for allowing observation of the elements contained in the chamber 40. They are however omitted in the illustration in FIG. 1 only for the sake of convenience in illustration.

In order to control the pressure and the temperature within the gastight chamber 40 which is defined by the wall 31, saddle 33, surface plate 35 and glass plate 37, the gastight chamber 40 is provided with a gas inlet port 41 formed in the saddle 33 and a gas outlet port 43 formed in the wall 31 at a position opposite to the inlet port 41, with respect to the projection lens system 23. The inlet and outlet ports 41 and 43 are communicated with each other by means of an intake duct 47, an exhaust duct 49 and a gas-blowing fan 45 connecting the ducts 47 and 49. An intake throttle valve 51 is disposed in the inlet port 41, while an exhaust throttle valve 53 is disposed in the outlet port 43. Also, a first motor 55 and a second motor 57 are provided which are connected to the throttle valves 51 and 53, respectively, to drive them so as to adjust the degree of opening of the inlet and outlet ports 41 and 43, respectively.

The gastight chamber 40 is further provided with a fine-adjusting gas inlet port 59 formed in the wall 31 at a position above the outlet port 43, and a fine-adjusting gas outlet port 60 formed in a shoulder of the chamber 40, lying in the same plane as the parallel-surface glass plate 37. Disposed within the inlet and outlet ports 59 and 60, respectively, are dust-collecting filters 63 and 65, and an intake fine-adjusting valve 67 and an exhaust fine-adjusting valve 69 placed outside of the filters 63 and 65, respectively. A third motor 71 and a fourth motor 73 are connected to the fine-adjusting valves 67 and 69, respectively, to drive them so as to adjust the degree of opening of the fine-adjusting inlet and outlet ports 59 and 60, respectively.

The gastight chamber 40 is further provided with a dust-collecting filter 75 placed at a position inwardly or downstream of the inlet port 41 so as to receive the gas or air flowing into the gastight chamber 40. Also, a temperature sensor 77 is provided at a gastight chamber side of the filter 75. Additionally, a pressure sensor 79 is provided within the gastight chamber 40, the pressure sensor 79 being disposed on a portion of the surface plate 35 adjacent the outlet port 43.

Provided in the intake duct 47 is a temperature regulating unit 80 which comprises a heating device 81 and a refrigerating device 83. A motor 85 is connected to the blowing fan 45 to drive the same.

The drives of the temperature regulating unit 80, the fan motor 85 and the four motors 55, 57, 71 and 73 are controlled on the basis of the information (temperature information and pressure information) obtainable from the temperature sensor 77 and the pressure sensor 79, both disposed in the gastight chamber 40.

Description will now be made to regulation of the factors of disturbance in the stepper of the structure described above.

The blowing fan 45 is adapted to blow the gas or air into the gastight chamber 40 through the intake duct 47, the temperature regulating unit 80, the intake throttle valve 51 and the filter 75, and from the back of the saddle 33. The gas or air flown into the gastight chamber 40 circulates within the same chamber and, thereafter, it is flown into the exhaust duct 49 by way of the exhaust throttle valve 53 and then is introduced into an inlet port of the blowing fan 45. Thus, one continuous closed loop of the gas flow is defined.

The pressure within the gastight chamber 40 can be adjusted finely, in relation to the atmospheric or ambient pressure. That is, when the intake fine-adjusting valve 67 is moved in an opening direction, the surrounding gas or air is introduced into the gastight chamber 40, whereas the gas contained in the gastight chamber 40 is flown out from the exhaust port 60 when the exhaust fine-adjusting valve 69 is moved in an opening direction.

In the manner as described above, the pressure within the gastight chamber 40 is regulated at a substantially constant level.

Regulation of the temperature can be achieved by the temperature regulating unit 80. That is, on the basis of the information related to the temperature within the gastight chamber 40 and obtainable from the temperature sensor 77, the refrigerating device 83 of the temperature regulating unit 80 is driven if the temperature within the gatight chamber 40 becomes higher or, alternatively, the heating device 81 of the temperature regulating unit 80 is driven if the temperature in the gastight chamber 40 becomes lower. By such temperature control, a cooled or warmed gas or air is supplied into the gastight chamber 40 from the temperature regulating unit 80.

Figure 2:
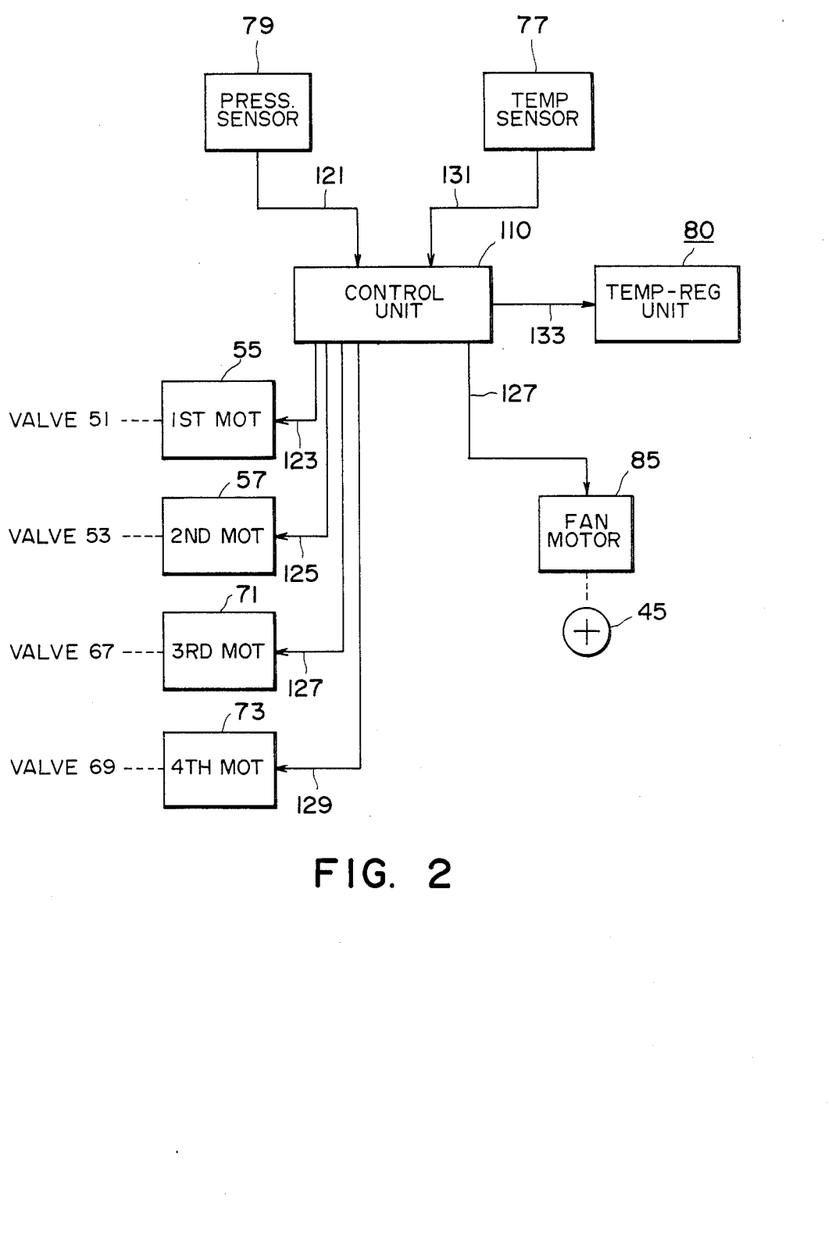
FIG. 2 is a diagram of a control system in a projection exposure apparatus according to the FIG. 1 embodiment.

FIG. 2 is a block diagram of a control system for regulating the pressure and the temperature in the stepper shown in FIG. 1. The control operations necessary for the regulation are conducted by a control unit 110 which comprises a microprocessor, a memory and the like.

Referring to FIGS. 1 and 2, a pressure signal 121 representing an absolute pressure as detected by the pressure sensor 79 disposed in the gastight chamber 40 is supplied to the control unit 110. In the control unit 110, a specified value (target value) which is a constant value at which the pressure in the gastight chamber 40 should be maintained are preparatively set. Thus, if there is a difference between the specified value and the detected pressure as represented by the pressure signal 121, an appropriate one or ones of the throttle valves are opened and/or closed. If the detected pressure is lower than the desired level, a first throttle control signal 123 and a second throttle control signal 125 are applied to the first and second motors 55 and 57, respectively, so as to move the intake throttle valve 51 in the opening direction and to move the exhaust throttle valve 53 in the closing direction. If, on the other hand, the detected pressure is higher than the desired level, the control unit 110 produces similar control signals 123 and 125 which are effective to move the intake throttle valve 51 in the closing direction and to move the exhaust throttle valve 53 in the opening direction. In this manner, the opening or closing movements of the throttle valves 51 and 53 are controlled in response to the control signals 123 and 125. By this, the intake and exhaust pressures to be produced by the blowing fan 45, i.e. the amount of gas or air to be introduced into the gastight chamber 40 and the amount of gas or air to be exhausted from the gastight chamber 40, are regulated and, as a result of which, the pressure in the gastight chamber 40 is regulated at the specified pressure.

If there is a large difference between the detected pressure and the specified pressure, one of the intake throttle valve 51 and the exhaust throttle valve 53 will be moved to or maintained at the closing position. If, on the other hand, the pressure difference is small, both the intake throttle valve 51 and the exhaust throttle valve 53 will be moved to or maintained at their full-open positions. However, it is desired that a substantially constant gas flow or air flow is stably maintained within the gastight chamber 40. For this reason, the control unit 110 is arranged to detect the degree of opening and/or closing of each of the throttle valves 51 and 53 (details of which are conventional), and also is arranged to produce, on the basis of the detected pressure and the information on the positions of the throttle valves, a fan control signal 127 for controlling the rotatary force or power of the fan motor 85.

Since, as described, the degree of opening/closing of each of the intake throttle valve 51 and the exhaust throttle valve 53 is set or determined premising the existence of a steddy flow, fine adjustment of the pressure in the gastight chamber 40 may be difficult to achieve. In view of this, the control unit 110 is also arranged to supply a fine-adjusting throttle control signal 127 or 129 to the third motor 71 or the fouth motor 73, so as to move the intake fine-adjusting valve 67 in the opening direction in a case where the detected pressure is lower than the desired level, and to move the exhaust fine-adjusting valve 69 in the opening direction in a case where detected pressure is higher than the desired level. By doing so, the absolute pressure in the gastight chamber 40 can be adjusted finely and, as a result of which, precise regulation of the pressure in the gastight chamber is assured.

Next, description will be made to regulation of the temperature in the gastight chamber 40.

The temperature in the gastight chamber 40 is detected by the temperature sensor 77 disposed in the gastight chamber 40. And, a temperature signal 131 representing the detected temperature is produced by the temperature sensor 77 and is supplied to the control unit 110. In the control unit 110, a specified temperature value (target value) which is a constant value at which the temperature in the gastight chamber 40 should be regulated has been preparatively set and stored. If there is a difference between the specified temperature and the detected temperature, the control unit 110 produces a temperature regulating signal 133, in accordance with the nature (higher or lower) and the magnitude of the difference, and supplies the temperature regulating signal 113 to the temperature regulating unit 80, the temperature regulating signal 133 being effective to actuate the refrigerating device 83 or the heating device 81 and to control the degree of refrigeration or heating by the device 83 or 81. The temperature detection and the corresponding temperature control are carried out continuously, whereby the temperature of the gas or air blown by the fan 45 can be regulated at a sustantially constant level. The temperature-regulated gas or air passes through the filter 75 and, then, flows within the gastight chamber 40 as a steddy flow, particularly over the portions surrounding the projection lens system 23 and around the X-Y stage 27. As a result, the temperature in the gastight chamber 40 is regulated and, the temperature of each of the elements contained in the gastight chamber 40 is maintained constant.

In the manner as described above, regulation of the pressure and temperature in the gastight chamber 40 is accomplished, whereby the optical performance of the exposure apparatus, particularly of the projection lens system 23, are maintained stable.

Superficially, it seems that the provision of the gastight chamber 40 as in the present embodiment leads to complexity of the structure of the apparatus. Actually, however, the structure is very simple as compared with that which is arranged to adjust or displace a portion of the projection lens system, assembled with a high precision, so as to change the magnificaton of the projection lens system. Accordingly, the projection exposure apparatus according to the present embodiment can be manufactured very easily.

Since major components of the projection exposure apparatus are contained in the gastight chamber and thus isolated from the environmental conditions, the pattern transfer operation is hardly affected by dust or foreign particles. This is very preferable.

Figure 3:
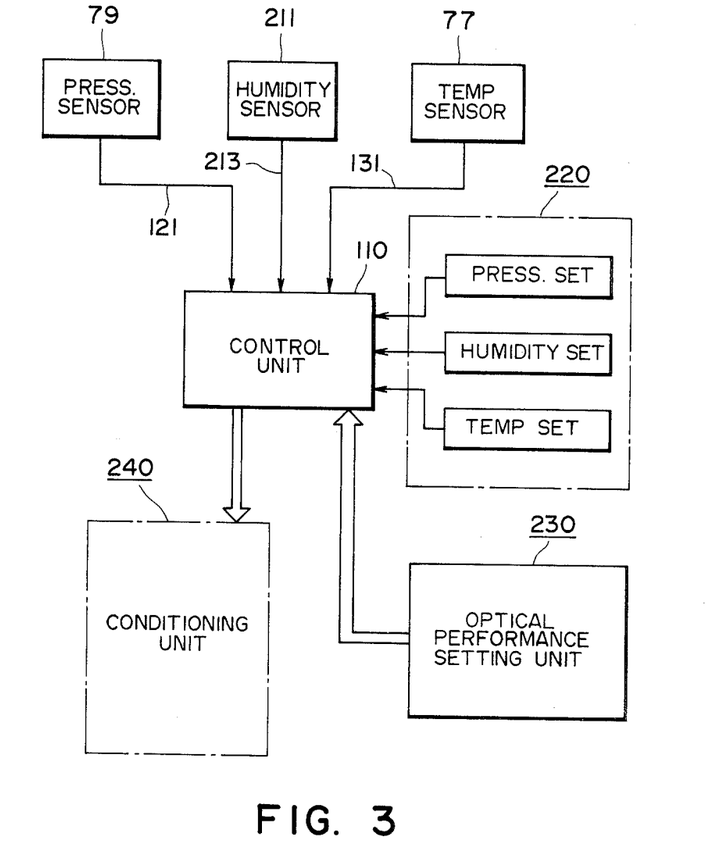
FIG. 3 is a diagram of a control system in a projection apparatus according to another embodiment of the present invention.

FIG. 3 is a block diagram of a control system used in a projection exposure apparatus according to another embodiment of the present invention. In this embodiment, the elements having similar functions as their corresponding elements in the first embodiment are denoted by the same reference numerals. The major difference of the FIG. 3 arrangement over the FIG. 2 arrangement is that, in the FIG. 3 embodiment, the humidity, in addition to the pressure and the temperature, is detected for the sake of control of the optical performance of the projection optical system.

In FIG. 3, a humidity sensor 211 is disposed in the gastight chamber 40 (see FIG. 1) so as to detect the humidity in the gastight chamber 40. The humidity sensor 211 produces a humidity signal 213 representing the detected humidity and supplies it to the control unit 110. A specified-value setting unit 220 is separately provided, by which unit a desired pressure, a desired temperature and a desired humidity to be established in the gastight chamber 40 have been prepatively set, and the set data have been prepatively stored into the control unit 110. Further, an optical performance setting unit 230 is provided. By this unit 230, the coefficient of change for each of the focus position, the magnification and the distortion of the projection lens system as well as the desired or target values thereof have been preparatively set. Also, the data set by the setting unit 230 are preparatively stored in the control unit 110. The control signals outputted from the control unit 110 are supplied to a conditioning unit 240. The conditioning unit 240 includes the four motors 55, 57, 71 and 73, the fan motor 85 and the blowing fan 45 (shown in FIGS. 1 and 2) in a case where only the pressure in the gastight chamber 40 is a factor which should be controlled. On the other hand, where the pressure and the temperature in the gastight chamber 40 are the factors which should be controlled, the conditioning unit 240 includes the temperature regulating unit 80 (see FIGS. 1 and 2) as well as the above-described elements.

When, in such arrangement, the humidity in the gastight chamber 40 is changed, such change is detected by the humidity sensor 211. Then, in accordance with the detected value as represented by the humidity signal 213, the optical performance of the projection lens system under the currently established (or changed) conditions is calculated by the control unit 110. This calculation is made on the basis of the variation coefficient or constant for the optical performance (i.e. the focus position, the magnification and the distortion) in relation to the condition change, preparatively stored in the control unit 110. Subsequently, in the control unit 110, the thus calculated optical performance is compared with the desired optical performance which has preparatively been stored in the control unit 110. On the basis of the result of comparison, the control unit 110 supplies a control signal to the conditioning unit 240 so as to control the pressure and/or the temperature in the gastight chamber 40. More specifically, the control unit 110 calculates the amount of change in the optical performance to be caused by the change in humidity, in terms of the amount of change in the optical performance to be caused by the change in pressure only or in pressure and temperature. Then, the control unit 110 supplies a control signal to the conditioning unit 240 to control only the pressure or both the pressure and the temperature, so as to minimize the difference between the "cal-culated" optical performance and the "desired" optical performances as detected by the aforementioned comparison. As a result, the desired or specified optical performance can be stably retained regardless of the change in the disturbance factor, particularly the humidity in this case.

Generally, the change in the optical performance resulting from the changes in temperature, pressure and humidity can be expressed by the following equation:

$$\Delta E = K_1 \Delta T + K_2 \cdot \Delta P + K_3 \Delta H$$

wherein $\Delta E$ = the amount of change in the optical performance;

$\Delta T$ = the amount of change in the temperature from the specified condition;

$\Delta P$ = the amount of change in the pressure from the specified condition;

$\Delta H$ = the amount of change in the humidity from the specified condition; and $K_1, K_2, K_3$ = constants.

It is seen therefrom that, if the humidity is changed, the amount of change in the pressure which is to be made so as to compensate for the change in the optical performance resulting from the humidity change, while retaining the temperature at its specified level, can be calculated in the following manner:

Since the temperature should be retained at its level in the case, $\Delta T = 0$. Therefore, from the above equation, it follows that $$K_2 \Delta P + K_3 \Delta H = 0$$

should be satisfied in order to retain the predetermined or desired optical performance.

From this, it is seen that the amount $\Delta P_1$ of the change in pressure to be made so as to compensate for the change in humidity by an amount $\Delta H_1$ can be given by the following equation:

$$\Delta P_1 = -K_3/K_2 \cdot \Delta H_1$$

This means that, if the humidity is changed by an amount $\Delta H_1$, the desired optical performance can be retained by changing the pressure by an amount $-K_3/K_2 \Delta H$ ($=\Delta P$). Since the constant $K_3$ is sufficiently small as compared with the constant $K_2$, the pressure change to be made to cancel the humidity change can be sufficient small.

The constants $K_1$, $K_2$ and $K_3$ are obtainable on the basis of experiments. The above-described manner of calculation is essentially applicable to the case where the change in optical performance resulting from the humidity change should be compensated for by changing the pressure and temperature. So, explanation thereof will be omitted here for the sake of simplicity. Similarly, in the latter case, the constant $K_3$ is sufficiently small as compared with the constant $K_1$.

The change in pressure has a direct relevance only to the optical performance of the projection lens system. Therefore, control of the pressure as in the present embodiment so as to forcibly change the magnification and the distortion would not cause disadvantageous effects on other elements, due to the temperature adjustment as in the prior art.

While, in the FIG. 1 arrangement, the intake fine-adjusting valve 67 and the exhaust fine-adjusting valve 69 are separately provided, single valve means may be commonly used for the sake of both the introduction and the exhaustion of gas or air. In such case, however, the dust for foreign particles collected by the filter during exhaustion may be scattered into the gastight chamber 40 during introduction of the gas. For this reason, separate provision of the intake valve and the exhaust valve as in the FIG. 1 embodiment is preferable. Also, the provision of the intake fine-adjusting valve 67 at a position adjacent to the outlet port 43 which is a dominant component for effecting the exhaustion is effective to reduce the temperature change in the gastight chamber 40.

In the foregoing embodiments, the present invention has been described with reference to a projection exposure apparatus in which a projection optical system as well as a reticle and a wafer which are to be subjected to the pattern transfer operation by means of the projection optical system are contained in the gastight chamber 40 whose pressure and temperature are regulated in a specific manner. However, the stepper usually includes, in addition to the projection optical system, various optical systems such as an alignment optical system, an automatic focusing optical system and the like. Similarly, these optical systems are susceptible to the pressure, the temperature and the humidity. It is therefore preferable to house these additional optical systems within the gastight chamber 40, as required. Further, in addition to these optical systems, a focus detecting mechanism using air-micrometers, and other components used in a stepper may be susceptible to changes in the pressure. Accordingly, more preferable results are obtainable where such mechanism as well as the optical systems are contained in the gastight chamber 40.

While, in the foregoing embodiments, the invention has been described with reference to a semiconductor manufacturing projection exposure apparatus, the invention is not limited thereto. For example, the invention is effectively applicable to an optical device in which a high-precision optical performance should be attained. That is, if the optical performance of such device is adversely affected by at least one of the pressure, the temperature and the humidity, the portion of the components of such optical device which is susceptible to the factors of disturbance can be contained in a gastight chamber according to the present invention, thereby to avoid the disadvantageous effects of such factor of disturbance.

In accordance with the present invention, as has hitherto been described, the pressure, the temperature and/or the humidity which are the factors of disturbance affecting against the optical performance of an optical system can be regulated within a substantially closed space, whereby the optical performance of the optical system can be maintained stable. Also, according to the present invention, an inlet port and an outlet port for providing a steddy flow of a gas or air in a substantially closed space are provided at positions opposite to each other with respect to an optical system whose optical performance should be maintained stable. This is effective to avoide the necessity of providing an additional fan or other means for positively circulating the gas or air in the substantially closed space. Therefore, the portion of the projection exposure apparatus surrounding the projection optical system can be made simple, which is desirable for the sake of achieving high-precision pattern transfer. Further, according to the present invention, the introduction of gas or air into the gastight chamber and the exhaustion of the gas or air from the gastight chamber can be controlled independently from each other. As a result, the pressure in the gastight chamber can be controlled more precisely.

While the invention has been described with reference to the structures disclosed herein, it is not confined to the details set forth and this application is intended to cover such modifications or changes as many come within the purposes of the improvements or the scope of the following claims.

What is claimed is:

1. An apparatus for transferring a pattern of a first member onto a second member, said apparatus comprising:

projection optical means for optically projecting the pattern of the first member onto the second member;

means for illuminating the first member so as to transfer, with said projection optical means, the pattern of the first member onto the second member;

chamber means for housing at least said projection optical means in a substanitally closed space, said chamber means having an inlet port and an outlet port;

means for detecting pressure in said substantially closed space; and means for controlling the pressure in said space on the basis of detection by said detecting means so as to retain a predetermined optical performance of said projection optical means, said controlling means comprising (i) a gas passageway in communication with said space via said inlet port and said outlet port, respectively, (ii) gas flowing means for flowing a gas in said passageway into said space through said inlet port and for extracting a gas in said space to said passageway through said outlet port and (iii) means for controlling the degree of opening of at least one of said inlet port and outlet port in accordance with the detected pressure.

2. An apparatus according to claim 1, wherein said chamber means is adapted to house the first and second members in said space in which said projection means is housed.

3. An apparatus according to claim 1, further comprising means for detecting a temperature of a gas contained in said space and means for controlling, on the basis of detection by said temperature detecting means, the temperature of the gas contained in said space thereby to retain the predetermined optical performance of said projection optical means.

4. An apparatus according to claim 3, wherein said temperature controlling means includes means for heating the gas to be supplied into said space and means for cooling the gas to be supplied into said space.

5. An apparatus according to claim 1, wherein said housing means is provided with an opening formed at a position adjacent to said outlet port, for allowing introduction of the gas from an exterior of said housing means.

6. An apparatus according to claim 1, further comprising means for controlling a temperature of a gas flowing from said flowing means to said inlet port of said housing means.

7. An apparatus according to claim 1, wherein said inlet port and said outlet port of said housing means are disposed at positions opposite to each other with respect to said projection optical means.

8. An apparatus according to claim 1, wherein said pressure controlling means controls pressure of a gas contained in said space so as to correct a change in the optical performance of said projection optical means resulting from a change in humidity of the gas contained in said space.

* * * * *

UNITED STATES PATENT AND TRADEMARK OFFICE
CERTIFICATE OF CORRECTION

PATENT NO. : 4,786,947

DATED : November 22, 1988

INVENTOR(S) : MASAO KOSUGI, ET AL.

It is certified that error appears in the above-identified patent and that said Letters Patent is hereby corrected as shown below:

COLUMN 1

Line 19, "an" should be deleted.
Line 23, "like." should read --like).--.

COLUMN 5

Line 7, "gatight" should read --gastight--.

COLUMN 6

Line 4, "steddy" should read --steady--.
Line 45, "steddy" should read --steady--.

COLUMN 8

Line 11, "$\Delta E = K_1 \Delta T + K_2 \cdot \Delta P + K_3 \Delta H$" should read
--$\Delta E = K_1 \cdot \Delta T + K_2 \cdot \Delta P + K_3 \cdot \Delta H$--.

Line 33, "$K_2 \Delta P + K_3 \Delta H = 0$" should read --$K_2 \cdot \Delta P + K_3 \cdot \Delta H = 0$--.

UNITED STATES PATENT AND TRADEMARK OFFICE
CERTIFICATE OF CORRECTION

PATENT NO. : 4,786,947

DATED : November 22, 1988

INVENTOR(S) : MASAO KOSUGI, ET AL.  Page 2 of 2

It is certified that error appears in the above-identified patent and that said Letters Patent is hereby corrected as shown below:

COLUMN 9

Line 4, "for" should read --or--.
    Line 55, "steddy" should read --steady--.
    Line 59, "avoide" should read --avoid--.

COLUMN 10

Line 19, "substanitally" should read --substantially--.

Signed and Sealed this

Twelfth Day of December, 1989

*Attest:*

JEFFREY M. SAMUELS

*Attesting Officer*    *Acting Commissioner of Patents and Trademarks*